US00RE36292E

United States Patent [19]

Scarrá et al.

[11] E Patent Number: Re. 36,292

[45] Reissued Date of Patent: Sep. 7, 1999

[54] OPERATIONAL ANALYSIS DEVICE OF THE SCAN PATH TYPE HAVING A SINGLE SCANNING CLOCK AND A SINGLE OUTPUT PHASE FOR AN INTEGRATED CIRCUIT

[75] Inventors: Flavio Scarrá, Osnagola; Maurizio Gaibotti, Milan, both of Italy

[73] Assignee: STMicroelectronics, Inc., Carrollton, Tex.

[21] Appl. No.: 08/876,130

[22] Filed: Jun. 23, 1997

Related U.S. Patent Documents

Reissue of:

[64] Patent No.: 5,225,724
Issued: Jul. 6, 1993
Appl. No.: 07/781,360
Filed: Oct. 22, 1991

[63] Continuation of application No. 08/498,856, Jul. 6, 1995, abandoned.

[30] Foreign Application Priority Data

Oct. 22, 1990 [IT] Italy ..... 21820A/90

[51] Int. Cl.[6] ..... H03K 19/096; G01R 31/28

[52] U.S. Cl. ..... 326/16; 326/46; 326/97; 327/203; 327/225; 371/22.34; 371/22.36; 324/73.1

[58] Field of Search ..... 326/95, 93, 46, 326/16, 97; 371/22.34, 22.36; 327/203, 225; 324/73.1

[56] References Cited

U.S. PATENT DOCUMENTS

| | | | |
|---|---|---|---|
| 4,495,629 | 1/1985 | Zasio et al. | 377/70 |
| 4,701,922 | 10/1987 | Kuboki et al. | 371/25 |
| 4,706,299 | 11/1987 | Jorgensen et al. | 455/608 |
| 4,710,933 | 12/1987 | Powell et al. | 371/25 |
| 4,780,666 | 10/1988 | Sakashita et al. | 324/73 R |
| 4,799,004 | 1/1989 | Mori | 324/73 R |
| 4,855,669 | 8/1989 | Mahoney | 324/73 R |
| 4,862,068 | 8/1989 | Kawashima et al. | 324/73 R |
| 4,864,579 | 9/1989 | Kishida et al. | 371/22.3 |
| 4,995,039 | 2/1991 | Sakashita et al. | 371/22.3 |
| 5,032,783 | 7/1991 | Hwang et al. | 324/73.1 |
| 5,130,647 | 7/1992 | Sakashita et al. | 324/158 R |
| 5,220,217 | 6/1993 | Scarrá | 307/481 |

FOREIGN PATENT DOCUMENTS 2193330 2/1988 United Kingdom .

*Primary Examiner*—Michael J. Tokar
*Assistant Examiner*—Richard Roseen
*Attorney, Agent, or Firm*—David V. Carlson; Seed and Berry LLP

[57] ABSTRACT

The device comprises a first chain of scanning cells located at the stimulation input of each respective functional block of the integrated circuit and a second chain of scanning cells located at the assessment output of each respective functional block of the integrated circuit. Each cell comprises a master part, a slave part and switching circuit to alternately enable the master and slave parts under the control of respective master clock and slave clock signals coincident with opposite phases of a scanning clock signal having a substantially square wave. With each pair of chains of scanning cells there are associated clock generators to locally obtain the master and slave clocks from the scanning clock.

33 Claims, 3 Drawing Sheets

OPERATIONAL ANALYSIS DEVICE OF THE SCAN PATH TYPE HAVING A SINGLE SCANNING CLOCK AND A SINGLE OUTPUT PHASE FOR AN INTEGRATED CIRCUIT

Matter enclosed in heavy brackets [ ] appears in the original patent but forms no part of this reissue specification; matter printed in italics indicates the additions made by reissue.

*CROSS-REFERENCE TO RELATED APPLICATION*

*This application is a file wrapper continuation of U.S. patent application Ser. No. 08/498,856, filed Jul. 6 1995, now abandoned.*

TECHNICAL FIELD

The present invention relates to an operational analysis device of the scan path type having a single scanning clock and a single output phase for an integrated circuit.

BACKGROUND OF THE INVENTION

Scan path is a type of analysis well-known for checking whether one or more functional blocks of an integrated circuit is operating correctly.

It is based on the use of serial-type scanning signals which operate on chains of scanning cells (latches) located at the input and output of individual functional blocks with a function of stimulation and assessment, respectively, of the operational state of the same functional blocks.

In this way it is possible to progressively update the operational state of the functional block under examination and to correspondingly obtain at output a signal indicative of the various operational states assumed by the same functional block with each inquiry of the serial signal at input.

In this respect it should be noted that a device such as a microprocessor is constituted to a large extent by a clocked sequential logic, that is, operating at a fixed rate set by a clock signal. It is thus easy to identify functional blocks whose input and output signals are clocked, that is, are controlled by a clock signal.

It appears evident that, if the clocking phase of the inputs of said functional blocks is lengthened to allow by means of serial scanning the alteration of some or all of the same inputs, nothing is damaged. This hypothesis is naturally valid as long as the logic is static.

In the case of a generic functional block made with a static logic it is possible to define the "stimulation phase" as the phase wherein the inputs are memorized and the "assessment phase" as the phase wherein the outputs of the functional block are stored in outputs cells or latches.

It is also possible to say in general that the alteration requested by a scan path analysis with respect to the original logic is represented by the addition of scanning or latch cells at each input and output, connecting the inserted one to the pre-existing one so as to maintain the old function, that is memorizing in parallel the input signal coming from the normal functional path or receiving and memorizing the serial inputs coming from an external path.

Each scanning cell (latch) consists of a master part and of a slave part, which are clocked on opposite phases of a scanning clock. The scanning cell stores the new data presented at input and presents the previously stored data at output, respectively.

In the known devices, the two phases of the scanning clock are generated at the input of the integrated circuit and must propagate through many gates, until they reach the cells concerned. Because of the different time delays in the transistors, this involves the risk of an overlap of the two phases, especially in the case of very long paths, with the consequent possible charging of the master part with the slave part still open and the consequent possible immediate loss of the new content introduced into the master part.

SUMMARY OF THE INVENTION

The main object of the present invention is that of providing an operational analysis device of the scan path type for an integrated circuit that does not present the above-mentioned drawback.

Another object of the present invention is that of providing a device of the above-mentioned type which allows the isolation of input from output and the separate analysis of the different functional blocks of the integrated circuit.

According to the invention such objects are attained with a device comprising a first chain of scanning cells located at the stimulation input of each respective functional block of the integrated circuit to be analyzed and a second chain of scanning cells located at the assessment output of each respective above-mentioned functional block, each cell comprising a master part, a slave part and switching means to alternately enable said master and slave parts under the control of respective master clock and slave clock signals coincident with opposite phases of a scanning clock signal having a substantially square wave, characterized in that it comprises clock generation means associated with each pair of chains of scanning cells to locally obtain said master and slave clocks from said scanning clock.

In this way the scanning clock signal can propagate itself through the integrated circuit in a single phase while the other phase is generated only locally, avoiding problems of partial superimposition of the two phases such as would occur in the case of the propagation of both phases over long paths.

Since, on the other hand, we are dealing with structures locally concentrated round the individual functional blocks, the local generation of the second phase clearly presents no difficulty of any kind.

As far as the problem of the reciprocal isolation of the integrated circuit's different functional blocks is concerned, this is solved according to the invention by connecting the scanning clocks of all the stimulation and assessment cells to respective phases of a machine clock and by disabling the operational clock of a given functional block under analysis for the phases required for updating the stimulation cells and the assessment cells of that functional block, during the stimulation phase and during the assessment phases, respectively, of the same block.

On the other hand, while still operating in two different phases of the machine clock, the device according to the invention is capable of having a single output phase. This can be obtained by providing the device itself with means capable of executing the temporal translation of one of the two output phases on the other phase with the consequent use of a single phase and of a single output pin.

The features of the present invention shall be better understood by means of the following detailed description of an embodiment illustrated as a non-limiting example in the enclosed drawings.

DETAILED DESCRIPTION OF THE INVENTION

Figure 1:
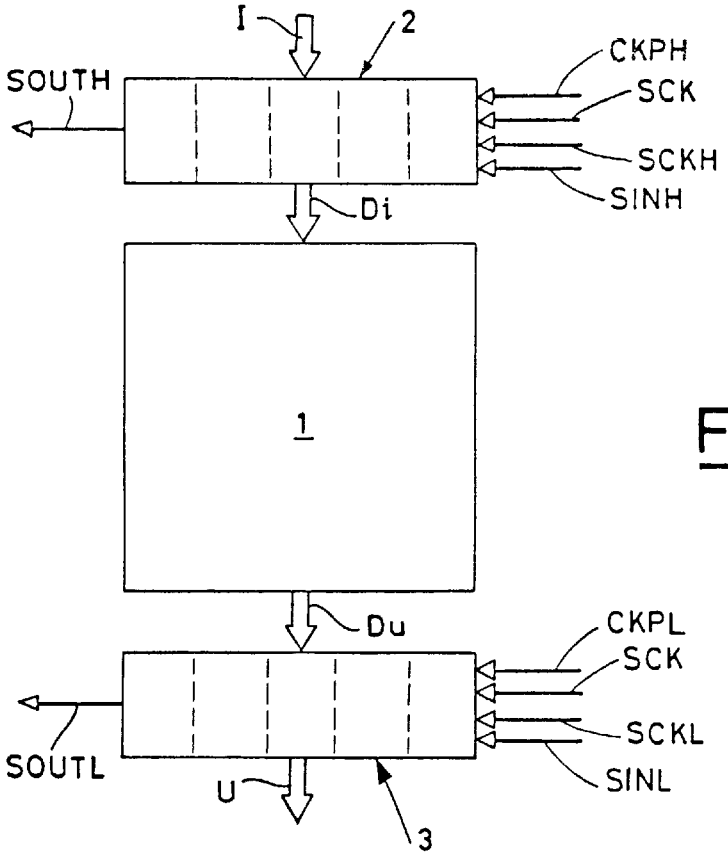
FIG. 1 shows the general diagram of a functional block of an integrated circuit provided with chains of stimulation and assessment scanning cells for the execution of operational analyses of the scan path type according to the present invention.

There is indicated in FIG. 1, a functional block 1 of an integrated circuit, such as a PLA (Programmable Logic Array), a ROM memory (Read-Only Memory) or more in general a static logic block.

Figure 2:
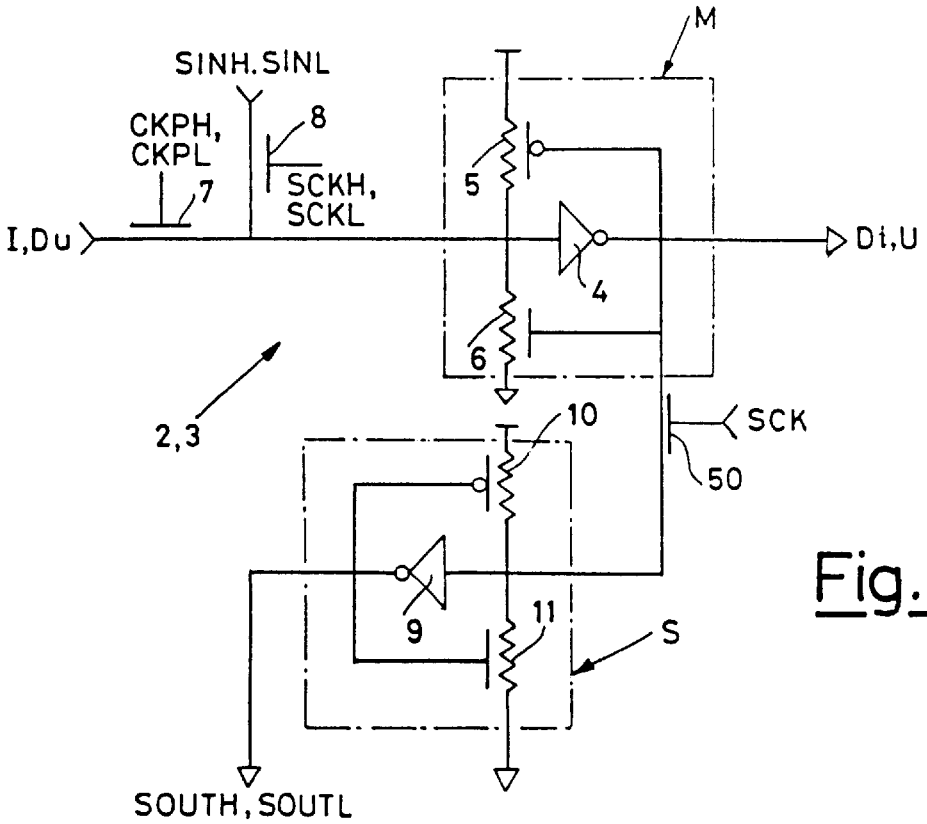
FIG. 2 shows the detailed diagram of a scanning cell included in the device according to the invention.

With the functional block 1 there are associated a chain of input scanning cells 2 and a chain of output scanning cells 3, which under normal operating conditions receive logic signals and clock at input I to be inserted as data Di in the functional block 1 in the stimulation phase, and deliver output signals U corresponding to the logic data Du read out of the same functional block in the assessment phase, respectively, all under the control of high and low phases CKPH and CKPL, respectively, of an operational clock CKP, as shown in FIG. 2. CKP is obtained from a machine clock CK which, in turn, is obtained from an external system clock XTALIN, as explained elsewhere herein.

According to the invention, during the scan path analysis, the operational clock CKP is clamped as described below and the scanning cells 2 and 3 receive respective alternated phases SINH and SINL of a serial scanning signal SIN under the control of a scanning clock SCK and of respective phases SCKH and SCKL being derived from the scanning clock SCK as later explained and shown in FIG. 4. The state of the scanning cell chains 2 and 3, indicative of the operational situation of the functional block 1, is provided at output from the above-mentioned chains in the form of the signals SOUTH and SOUTL, respectively. The signals that control the stimulations cells 2 have the convention of ending in the letter "H," and the signals that control the assessment cells 3 end in the letter "L," as shown in FIG. 1.

Each scanning cell 2 and 3 are preferably made as illustrated in FIG. 2, that is, each comprises essentially a master part M and a slave part S which store the new data at arrival and making available at output the data previously stored under control of the clocks. FIG. 2 illustrates a sample cell for both cells 2 and 3 and both signals are shown in the alternative, for each respectively, for illustration purposes. Thus, SCKH and SINH are the signal names for stimulation cells 2, and SCKL and SINL are the signal names applied to corresponding transistors for assessment cells 3. The output of cells 2 are Di and SOUTH, for parallel data and serial data, respectively; similarly U and SOUTL are the output of cells 3 for parallel output and serially output data, respectively.

The master part M comprises an inverter 4 and two resistive transistors 5 and 6 of the CMOS type, with a P channel and an N channel, respectively, having the drain source junctions placed in series between a positive power supply and the inverter's input and between the latter and ground, respectively, and the gates connected in common to the output of the inverter 4. According as to whether it is a cell 2 or a cell 3, there is applied to its input during normal operation the signal I or a data Du, that is controlled by a transistor 7 driven by the operational clock CKP, obtained from the machine clock CK, and determines at output, a corresponding data Di or the output signal U, respectively. During the scan path, on the other hand, said master parts M receive under the control of a transistor 8, driven by the respective high state of charging SCKH and SCKL of the scanning clock SCK, respective scanning signals SINH and SINL, which determine their switching to a different operational state, representative of the received signal.

The slave part S comprises in turn an inverter 9 with input connected to the output of the inverter 4 of the master part M through a transistor 50 driven by the scanning clock SCK and two resistive transistors 10 and 11 of the CMOS type, with a P channel and an N channel, respectively, having the drain-source junctions placed in series between a positive power supply and the inverter's input and between the latter and ground, respectively, and the gates connected in common to the output of the inverter 9. The slave part S operates only during the scan path and, under the control of the scanning clock SCK, operates so as to acquire the operational state of the corresponding master part M, which is thus put into the position of receiving and memorizing a new operational state determined by the subsequent scanning signal SINH or SINL. The operational state of the slave part S is provided at output as a signal SOUTH or SOUTL, for the cells 2 and 3, respectively.

Figure 3:
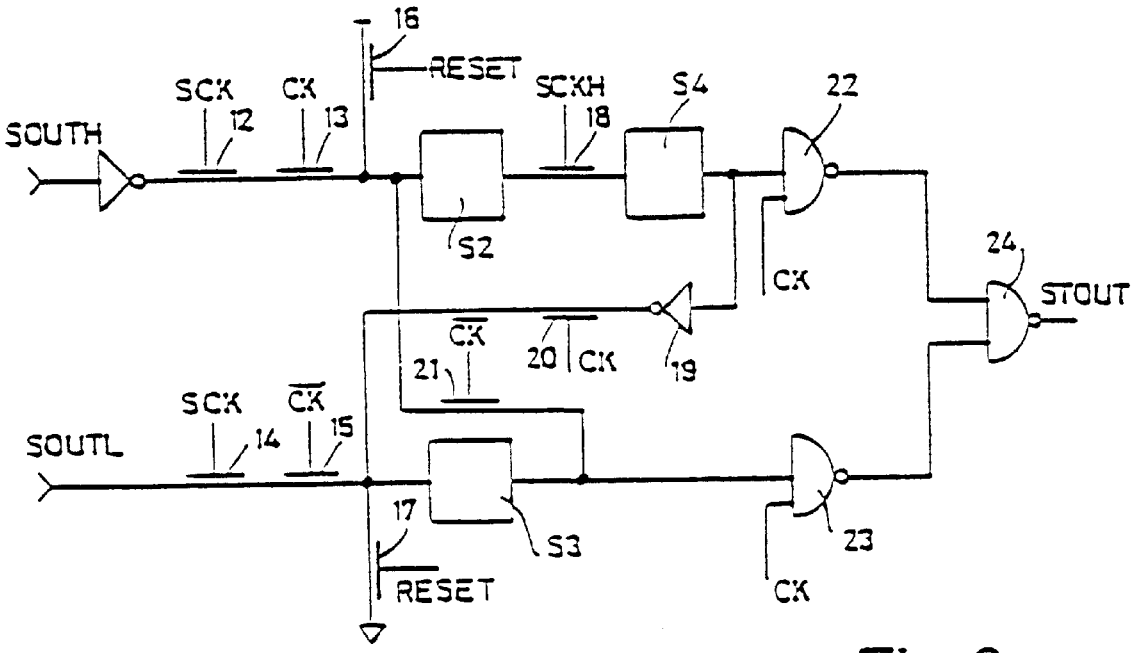
FIG. 3 shows the block diagram of an output circuit suitable for combining in a single phase the two output phases of the scan path analysis executed according to the invention.

The output signals SOUTH and SOUTL of the two cell chains 2 and 3 are received by a single serial output circuit illustrated in FIG. 3 and comprising two slave cells S2 and S3 coincident with the slave parts of the last scanning cell of the two chains 2 and 3 and a further additional slave cell S4. The slave cell S2 receives the high-phase output signal SOUTH through the series of two transistors 12 and 13 respectively controlled by the signals SCK and CK, while the slave cell S3 receives the low-phase output signal SOUTL through the series of two transistors 14 and 15 controlled by the signals SCK and $\overline{CK}$, respectively. Both the cells S2 and S3 are also subjected to the control of respective reset transistors 16 and 17. The slave cell S4 receives the output signal of the cell S2 through a transistor 18 controlled by the signal SCKH and its output is fed back to the input of the cell S3 through the series of an inverter 19 and of a transistor 20 controlled by the signal CK. Similarly, the output of the cell S3 is fed back to the input of the cell S2 through a transistor 21 controlled by the signal $\overline{CK}$. The outputs of the cells S4 and S3 are lastly applied at an input of respective logic gates 22 and 23 of the NAND type, to the other input of which the signal CK is respectively present. The outputs of the logic gates 22 and 23 are lastly applied at respective inputs of a logic gate 24 of the NAND type, which gives a serial signal STOUT at output on a single phase of the machine clock CK.

Figure 4:
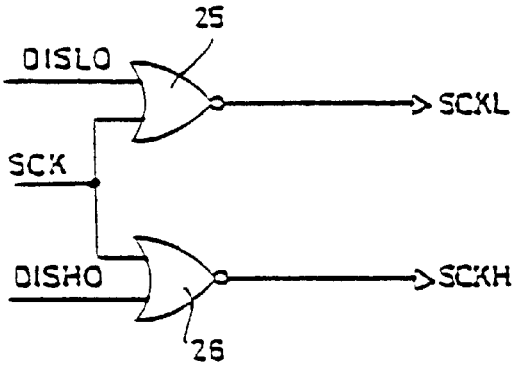
FIG. 4 shows the logic diagram of clock generation means to obtain locally from the scanning clock the second phase necessary for the master clocks of the individual scanning cells.

FIG. 4 shows the logic diagram of the clock generation means that are used to obtain locally from the scanning clock SCK the second phase SCKH, SCKL necessary for the master clocks of the individual scanning cells, as shown in FIG. 2.

Such clock generation means comprise two logic gates 25 and 26 of the NOR type, at an input of which the scan clock signal SCK is applied while at the other input a signal DISLO or DISHO, respectively, is applied, indicative of the low-phase or high-phase situation, respectively, of the machine clock signal CK. The outputs of the logic gates 25 and 26 provide the signals SCKL and SCKH, respectively, which are coupled to transistor 8 at FIG. 2 for the assessment cells 3 and stimulation cells 2, respectively. As will be appreciated from viewing FIGS. 4, 5, and 2, when Disable Low, DISLO is low, data can be read out serially into assessment cells 3 as signal SINL. When Disable High, DISHO, is low, data can be read serially into stimulation cells 2 as signal SINH.

Figure 5:
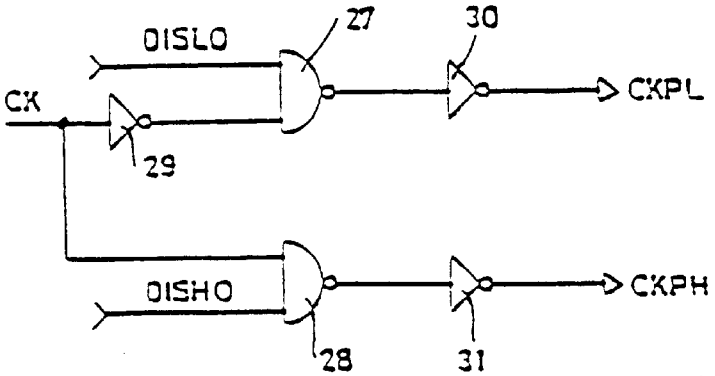
FIG. 5 shows the logic diagram of clock generation means to obtain an operational clock for an individual functional block from a machine clock available inside the integrated circuit of FIG. 1.

FIG. 5 shows in turn the means used to generate and possibly to disable the operational clock CKP starting from the machine clock signal. Such means comprise logic gates 27 and 28 of the NAND type, to an input of which, through an inverter 29 and in a direct manner, respectively, the machine clock signal CK is applied, while at the other input a signal DISLO or DISHO, respectively, is applied. The outputs of the logic gates 27 and 28 provide the operational clock signals CKPL and CKPH through respective inverters 30 and 31.

Many suitable circuits could be used to generate the scanning clock signal SCK and clamp the operational clock high (or low) as a combination of Enable Shift, ENSH, signal and External Clock XTALIN. For example, applying ENSH through an inverter to the inputs of two NAND gates and XTALIN to one of the NAND gates, and XTALIN through an inverter to the other NAND gate, and then the outputs of these two NAND gates as respective inputs of cross-coupled NAND gates generates the CK of FIGS. 6 and 7, as the output of one of the NAND gates. The output of the other NAND gate is input to an Exclusive-OR with XTALIN being the other input to the Exclusive-OR. The output of the Exclusive-OR is one input to a NOR gate and ENSH is applied through an inventor to the other input of the NOR gate to produce the SCK of FIGS. 6 and 7 as the output of the NOR gate. Other circuits could also be used to generate SCK and CK, as may be constructed by those of ordinary skill in the art given the teachings herein. Similarly, a person of skill in the art could construct a circuit to produce Disable High, DISHO and Disable Low, DISLO, upon receipt of the first leading edge of SCK.

Figure 6:
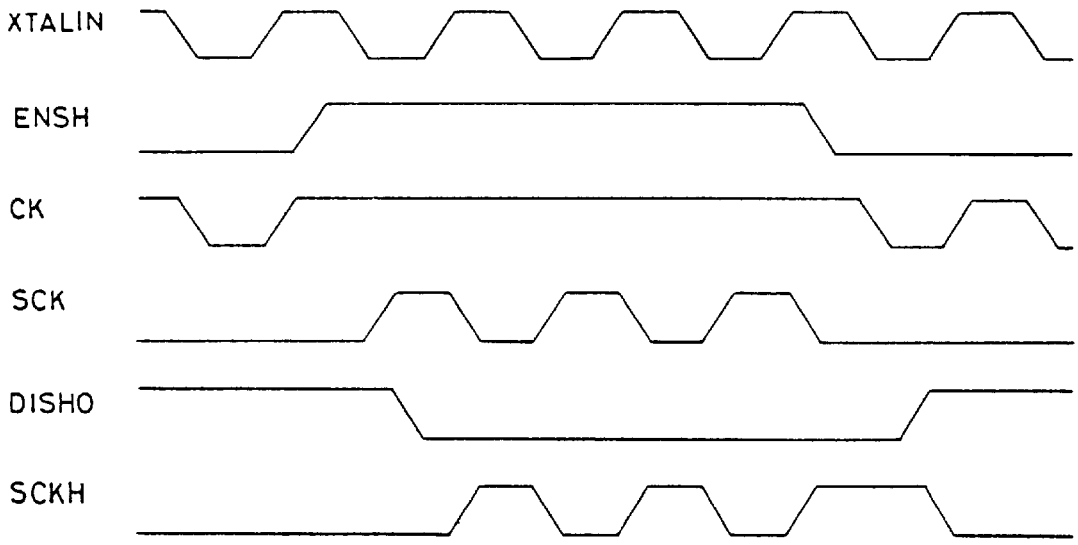
FIG. 6 shows in superimposed graph forms the waveforms of the signals related to the analysis of the pre-charging circuit of FIG. 1.
Figure 7:
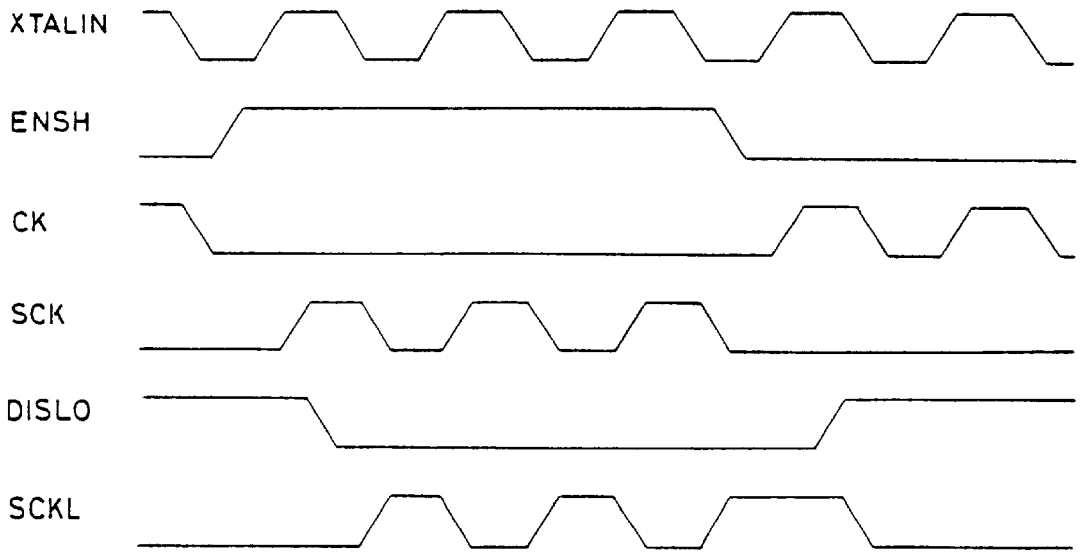
FIG. 7 shows in superimposed graph forms the waveforms of the signals related to the analysis of the assessment cells of the circuit of FIG. 1.

The manner of operation and timing of the device according to the invention is shown in the graphs of FIGS. 6 and 7, that refer to the high and low phases, respectively, of the machine clock CK.

It is shown in FIG. 6 that in the presence of a system clock signal XTALIN being high, the start of a scan path operation on a high phase, that is for cells 2, is determined by the rise of a signal ENSH clamping the machine clock CK on its high phase. The machine clock CK is thus clamped on high during the entire high scan path, only a representable part of which is shown here. A suitable circuit, not shown, enabled by the signal ENSH generates the scanning clock signal SCK, whose first leading edge determines the activation of the signal DISHO, which through the logic circuits of FIGS. 4 and 5 activates the scanning clock phase SCKH and clamps the operational clock CKP low (FIG. 2) and permits SCKH to go alternatively high and low on transistor 8, (see FIGS. 2 and 6), so as to allow the access of the serial scanning signal SINH to the various cells 2. The circuit disables the parallel access from the normal functional path via transistor 7 by holding CKP low, so as not to have any conflict between the parallel data and the serial data.

SCKH alternates with SCK to introduce into the master part M of the high-phase cells new serial data after SCK has caused the transfer of the previous data to the slave part S of the same cells, making them available at the corresponding outputs SOUTH. The output SOUTH of each individual cell of the chain 2 constitutes the input signal for the subsequent cell of the same chain, which is thus scanned in succession by the scanning signal SIN at the rate imparted by SCK and SCKH, while the machine clock CK remains clamped in the high phase. The output of the last cell of the chain 2 is fed as the input SOUTH of FIG. 3.

As in now clear, according to principles of the invention, locally generated clock SCKH is being used to clock data into the master and clock SCK into the slave, respectively. SCKH being generated from SCK ensures that the clock signals will not improperly overlap and that the master data will be transferred to the slave, (via transistor 50) only when valid data is in the master and the slave data is ready to be read out as SOUTH. Improper clocking in and clocking out of data is thus ensured of not occurring because locally generated clocks are used.

FIG. 7 shows the timing for the scanning of the chain of cells of assessment cells 3 (or low phase 3). The timing is also executed in the same manner, with the only difference that the signal ENSH this time clamps the machine clock CK in the low phase and SKC's first leading edge determines the activation of DISLO, which through the logic circuits of FIGS. 4 and 5 activates the scanning clock phase SCKL for cells 3. The circuit also clamps the operational clock CKP low so as to prevent parallel access and allow the access of the serial scanning signal SINL to the various cells 3. SCKL alternates with SCK to introduce into the master part M of the high-phase cells new serial data after SCK has caused the transfer of the previous data in the slave part S of the same cells, making them available at the corresponding outputs SOUTL. The output SOUTH of each individual cell of the chain 2 constitutes the input signal for the subsequent cell of the same chain, which is thus scanned in succession by the scanning signal SIN at the rate imparted by SCK and SCKH, while the machine clock CK remains clamped in the low phase.

As also explained with respect to FIG. 6, the previously mentioned possibility of attempting to clock data out of the slave and from the master to the slave can not occur because the locally generated clocks SCK and SCKL have an established relationship regardless of CK or XTALIN, or any propagation delays in other parts of the circuit.

A single integrated circuit may have many functional blocks 1 having respective stimulation cells 2 and assessment cells 3, each having their own locally generated clocks SCK, SCKP, and SCKL, if desired. The outputs of the cells 2 and 3 from one functional block are serially connected to subsequent cells 2 and 3 of other functional blocks to provide one serial input data stream and one serial output data stream, if desired.

Thus, globally for each functional block that is to be tested and stimulated through a direct and external access, care is taken to connect serially all the output signals SOUTH related to the scanning cells that operate on the high clock and all the output signals SOUTL related to the scanning cells that operate on the low clock. More in general, there can be groups of scanning cells with an output SOUTH connected as input or output cells of a functional block, and vice versa for SOUTL. It can thus occur that a serial string SOUTH or SOUTL refers partly to inputs and partly to outputs.

As already said earlier, the output signals SOUTH and SOUTL related to the high-phase and low-phase scanning cells are collected by the output circuit of FIG. 3, which through the intervention of the slave cell S4 transfers the high-phase outputs to the low phase and thus allows an output signal STOUT to be collected on a single phase CK and thus on a single output pin coupled to STOUT of the integrated circuit.

As previously mentioned, the functional blocks 1 can also be clocked by the locally generated clocks to ensure that the timing of output from the functional blocks into the assessment cells 3 occurs prior to reading data out of the assessment cells 3. This is solved according to the invention by disabling the operational clock for a given functional block and connecting the scanning clocks of the stimulation phase and the assessment phases to the respective phases of the local machine clock for that functional block. This occurs during the stimulation phase input data Di. It is known in the art that part of the signal Di input to the functional block 1 includes clocking information; according to the invention, the locally generated scanning clocks, as described herein, can be input with Di to control the timing of the functional block 1 as to ensure properly timed read-out of data Du and then SOUTL at maximum possible speed.

We claim:

1. Operational analysis device of the scan path type for an integrated circuit, comprising a first chain of scanning cells connected at the stimulation input of each respective functional block of the integrated circuit to be analyzed and a second chain of scanning cells connected at the assessment output of each respective functional block, each cell comprising a master part connected electrically to a first terminal of a switching means and a slave part connected electrically to a second terminal of the switching means, the switching means configured to alternately enable said master and slave parts under the control of respective master clock and slave clock signals coincident with opposite phases of a scanning clock signal [having a substantially square wave], each chain of scanning cells receives the scanning clock signal, and a clock generation means in each chain of scanning cells produces said master and slave clocks in response to said scanning clock.

2. Device according claim 1, characterized in that the scanning clocks of all stimulation and assessment cells are hooked to a phase of a machine clock, there being provided means for disabling an operational clock of a given functional block under analysis for phases of the operational clock required for updating the stimulation cells and the assessment cells of that functional block, during stimulation phases and during assessment phases, respectively, of the functional block.

3. Device according to claim 1, wherein said chains of scanning cells have respective output signals, one for each phase of the scanning clock, and time translation means are provided for combining said output signals into a single output signal at one output pin.

4. An operational analysis device of the scan path type for an integrated circuit containing a plurality of functional blocks and a scanning clock, comprising within a scanning cell associated with each functional block an operational clock generation circuit generating an operational clock for input to a first switching element associated with the scanning cell and a second switching element connected to the scanning cell, said second switching element responsive to the scanning clock.

5. The device of claim 4, further including a disabling circuit, said disabling circuit connected to the operational clock generation circuit of the scanning cell and selectively disabling the operational clock during a functional block updating period.

6. The device of claim 4, further comprising a master clock generation circuit associated with a first chain of scanning cells and a slave clock generation circuit associated with a second chain of scanning cells, said master clock circuit generating a master clock signal in response to the scanning clock and said slave clock generation circuit generating a slave clock signal in response to the scanning clock.

7. The device of claim 6, further including a disabling circuit, said disabling circuit connected to the operational clock generation circuit of the functional block and selectively disabling the operational clock during a functional block updating period.

8. The device according to claim 6 wherein said chains of scanning cells each have a respective output signal, the two output signals being combined through a signal adding circuit to form a single block output at one output pin.

9. An operational device of the scan path type for an integrated circuit containing a scanning clock and a plurality of functional blocks, comprising, within a scanning cell or set of scanning cells associated with a functional block or group of functional blocks, a master clock generator producing a master clock signal and a slave clock generator producing a slave clock signal each clock generator responsive to the scanning clock.

10. The device of claim 9 wherein the master clock generator produces the master clock in response to the slave clock.

11. The device of claim 10 wherein either of the master clock generator or the slave clock generator produces a second master clock or second slave clock, respectively, the second master clock or second slave clock controlling transfers of data out of a respective first chain of scanning cells or second chain of scanning cells and the first master clock or first slave clock controlling transfers of data into the first chain of scanning cells or second chain of scanning cells, respectively.

*12. A scan path for a functional block having a simulation input and an assessment output, comprising:*

*an input chain coupled to said simulation input and including a first scanning cell that is operable to receive a first scanning signal a first master clock, and a first slave clock;*

*an output chain coupled to said assessment output and including a second scanning cell operable to receive a second scanning signal, a second master clock, and a second slave clock;*

*said first and second scanning cells each comprising,*

*a master circuit operable to store a respective one of said scanning signals in response to a respective one of said master clocks, and*

*a slave circuit operable to store the contents of said master circuit in response to a respective one of said slave clocks; and*

*clock generation means operable to generate from a scanning clock said slave clocks and said master clocks such that said first and second slave clocks are of a substantially opposite phase from said first and second master clocks respectively said clock generation means positioned such that at said input and output chains,*

*said first and second slave clocks retain a minimum phase difference from said first and second master clocks respectively.*

*13. The scan path of claim 12 wherein:*

*said first scanning cell is operable to receive an operation signal and a first phase of an operational clock, and to store said operation signal in response to said first phase;*

*said second scanning cell is operable to receive an operational state from said assessment output, receive a second phase of said operational clock substantially opposite to said first phase, and store said operational state in response to said second phase; and*

*said scan path further comprises a means to disable said first and second phases of said operational clock when said first and second master clocks are respectively enabled.*

*14. The scan path of claim 12 wherein said slave clocks are substantially coincident with said scanning clock.*

*15. The scan path of claim 12 further comprising a time translation means operable to receive said contents of said slave circuits of said first and second scanning cells and to combine said contents into a single output signal.*

*16. A method for analyzing a functional block coupled to an input scanning cell including input master and slave latches, and coupled to an output scanning cell including output master and slave latches, comprising:*

*storing an input scanning signal in said input master latch in response to a first master clock;*

*loading said input scanning signal from said input master latch into said input slave latch in response to a first slave clock;*

*operating on said input scanning signal in said functional block to generate an operational state;*

*storing said operational state from said functional block in said output master latch in response to a phase of an operational clock;*

*loading said operational state from said output master latch into said output slave latch in response to a second slave clock;*

*storing an output scanning signal in said output master latch in response to a second master clock; and*

*generating from a scanning clock said master clocks and said slave clocks such that said first and second master clocks are substantially inverted with respect to said first and second slave clocks respectively and in a way that prevents improper phase overlap between said first and second slave clocks and said first and second master clocks respectively at said input and output scanning cells respectively.*

*17. The method of claim 16 further comprising providing the contents of said input and output slave latches on a single output terminal.*

*18. The method of claim 16 wherein said generating comprises generating said slave clocks equal to said scanning clock.*

*19. The method of claim 16 further comprising disabling said operational clock when said first and second master clocks are respectively enabled.*

*20. A method for analyzing a functional block coupled to an input scanning cell including input master and slave latches, and coupled to an output scanning cell including output master and slave latches, comprising:*

*storing an operational signal in said input master latch in response to a first phase of an operational clock;*

*operating on said operational signal in said functional block to generate an operational state;*

*storing said operational state from said functional block in said output master latch in response to a second phase of said operational clock;*

*loading said operational signal from said input master latch into said input slave latch in response to a first slave clock;*

*loading said operational state from said output master latch into said output slave latch in response to a second slave clock;*

*storing an input scanning signal in said input master latch in response to a first master clock;*

*storing an output scanning signal in said output master latch in response to a second master clock; and*

*generating from a scanning clock said first and second master clocks and said first and second slave clocks such that said first and second master clocks are substantially inverted with respect to said first and second slave clocks respectively and in a wave that prevents improper phase overlap between said first and second slave clocks and said first and second master clocks respectively at said input and output scanning cells respectively.*

*21. The method of claim 20 further comprising combining the contents of said input and output slave latches onto a single output terminal.*

*22. The method of claim 20 wherein said generating comprises generating said slave clocks equal to said scanning clock.*

*23. The method of claim 20 further comprising disabling said operational clock when said first and second master clocks are respectively enabled.*

*24. The method of claim 20 wherein said first phase of said operational clock is substantially inverted with respect to said second phase.*

*25. A scan path for a functional block having input and output terminals, comprising:*

*a first scanning cell, including,*

*a first master cell having a first input terminal and having a first output terminal coupled to said block input terminal,*

*a first slave cell having a second input terminal and a second output terminal,*

*a first master scanning switch coupled between said first input terminal and a third input terminal and having a first control terminal, and*

*a first slave scanning switch coupled between said first output and said second input terminals and having a second control terminal;*

*a second scanning cell, comprising,*

*a second master cell having fourth input and output terminals,*

*a second slave cell having fifth input and output terminals,*

*a second master scanning switch coupled between said fourth input terminal and a sixth input terminal and having a third control terminal, and*

*a second slave scanning switch coupled between said fourth output and said fifth input terminals and having a fourth control terminal;*

*a first clock generator having a seventh input terminal coupled to a scanning clock, a first master output terminal coupling to said first control terminal a first master clock, and a first slave output terminal coupling to said second control terminal a first slave clock that*

*is substantially inverted with respect to said first master clock, said first clock generator located within a predetermined distance from said first scanning cell; and*

*a second clock generator having an eighth input terminal coupled to said scanning clock, a second master output terminal providing to said third control terminal a second master clock and a second slave output terminal providing to said fourth control terminal a second slave clock that is substantially inverted with respect to said second master clock, said second clock generator located within said predetermined distance from said second scanning cell.*

*26. The scan path of claim 25 further comprising:*

*a first master operation switch coupled between said first input terminal and a ninth input terminal and having a fifth control terminal;*

*a second master operation switch coupled between said fourth input terminal and said block output terminal and having a sixth control terminal; and*

*a third clock generator having a tenth input terminal coupled to a system clock, a tenth output terminal providing to said fifth control terminal a first phase of an operational clock and an eleventh output terminal providing to said sixth control terminal a second phase of said operational clock substantially inverted with respect to said first phase.*

*27. The scan path of claim 26 wherein:*

*said first clock generator includes a first enable input terminal coupled to a first enable signal;*

*said second clock generator includes a second enable input terminal coupled to a second enable signal; and*

*said third clock generator includes third and fourth enable input terminals respectively coupled to said first and second enable signals such that when said first enable signal is in a first state said first clock generator is enabled and said third clock generator is disabled from providing said first phase of said operational clock, and when said second enable signal is in a second state, said second clock generator is enabled and said third clock generator is disabled from providing said second phase of said operational clock.*

*28. The scan path of claim 25 wherein:*

*said seventh input terminal is coupled to said first slave output terminal; and*

*said eighth input terminal is coupled to said second slave output terminal.*

*29. The scan path of claim 25 further comprising a circuit having a ninth input terminal coupled to said second output terminal and having a tenth input terminal coupled to said fifth output terminal, said circuit operable to provide the contents of said first and second slave cells on a single output terminal.*

*30. An integrated circuit, comprising:*

*one or more functional blocks having input and output terminals;*

*one or more input chains including at least one input scanning cell, each input chain associated with said input terminal of one of said blocks;*

*one or more output chains including at least one output scanning cell, each output chain associated with said output terminal of one of said blocks;*

*said input scanning cells each including,*

*an input master latch having a first input terminal coupled to an input scanning signal, a first output terminal coupled to an input terminal of an associated functional block, and a first clock terminal coupled to an input master clock, and*

*an input slave latch having a second input terminal coupled to said first output terminal, a second output terminal, and a second clock terminal coupled to an input slave clock;*

*said output scanning cells each including,*

*an output master latch having a third input terminal coupled to an output terminal of an associated functional block, a third output terminal, and a third clock terminal coupled to an output master clock, and*

*an output slave latch having a fourth input terminal coupled to said third output terminal, a fourth output terminal, and a fourth clock terminal coupled to an output slave clock;*

*a first clock generator operable to generate from a scanning clock said slave clocks and said master clocks such that said input and output slave clocks are of a substantially opposite phase from said input and output master clocks respectively, said clock generator positioned proximate one or more of said functional blocks such that at said input and output chains, the phases of said input and output slave clocks are different from the phases of said input and output master clocks respectively by at least a predetermined amount.*

*31. The circuit of claim 30 further comprising:*

*a second clock generator operable to generate from a system clock first and second phases of an operational clock except when said first clock generator generates said input and output master clocks respectively;*

*said input master latch having a fifth input terminal coupled to an operation signal and a fifth clock terminal coupled to said first phase of said operational clock; and*

*said output master latch having a sixth input terminal coupled to an output terminal of an associated function block and a sixth clock terminal coupled to said second phase of said operational clock.*

*32. The circuit of claim 30 wherein said slave clocks are substantially coincident with said scanning clock.*

*33. The circuit of claim 30 wherein said input chains are serially coupled together and said output chains are serially coupled together, the circuit further comprising a device having a fifth input terminal coupled to said second output terminal of the last input slave latch of the last input chain and having a sixth input terminal coupled to said fourth output terminal of the last output slave latch of the last output chain, said device operable to combine the contents of said last input and output slave cells onto a single terminal.*

* * * * *

UNITED STATES PATENT AND TRADEMARK OFFICE

CERTIFICATE OF CORRECTION

| | | |
|---|---|---|
| PATENT NO. | : | Re. 36,292 |
| DATED | : | September 7, 1999 |
| INVENTOR(S) | : | Flavio Scarrá and Maurizio Gaibotti |

It is certified that error appears in the above identified patent and that said Letters Patent is hereby corrected as shown below:

On the cover page, item [73] after "STMicroelectronics" please delete ", Inc." and insert therefor "S.r.l."

Signed and Sealed this

Twenty-ninth Day of May, 2001

*Attest:*

Nicholas P. Godici

NICHOLAS P. GODICI

*Attesting Officer*

*Acting Director of the United States Patent and Trademark Office*